United States Patent
Li et al.

(10) Patent No.: US 11,018,163 B2
(45) Date of Patent: May 25, 2021

(54) FAN-OUT STRUCTURE AND METHOD FOR MANUFACTURING THE SAME, AND DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yunze Li, Beijing (CN); Ni Yang, Beijing (CN); Zhijian Qi, Beijing (CN); Qi Hu, Beijing (CN); Jianfeng Liu, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 178 days.

(21) Appl. No.: 16/326,767

(22) PCT Filed: Aug. 23, 2018

(86) PCT No.: PCT/CN2018/101946
§ 371 (c)(1),
(2) Date: Feb. 20, 2019

(87) PCT Pub. No.: WO2019/144610
PCT Pub. Date: Aug. 1, 2019

(65) Prior Publication Data
US 2020/0411568 A1 Dec. 31, 2020

(30) Foreign Application Priority Data

Jan. 29, 2018 (CN) .......................... 201810083800.2

(51) Int. Cl.
*H01L 27/12* (2006.01)
*H01L 27/32* (2006.01)

(52) U.S. Cl.
CPC ...... *H01L 27/1244* (2013.01); *H01L 27/1255* (2013.01); *H01L 27/1259* (2013.01); *H01L 27/3279* (2013.01)

(58) Field of Classification Search
None
See application file for complete search history.

(56) References Cited

U.S. PATENT DOCUMENTS

| | | | |
|---|---|---|---|
| 6,315,384 B1 * | 11/2001 | Ramaswami | C07C 323/62 347/20 |
| 2008/0157364 A1 | 7/2008 | Yang et al. | |
| 2014/0098495 A1 | 4/2014 | Jeon | |

FOREIGN PATENT DOCUMENTS

| | | |
|---|---|---|
| CN | 201590281 U | 9/2010 |
| CN | 102243383 A | 11/2011 |

(Continued)

OTHER PUBLICATIONS

First Office Action for CN Appl. No. 201810083800.2, dated Mar. 26, 2019.

(Continued)

*Primary Examiner* — Bo B Jang
(74) *Attorney, Agent, or Firm* — The Webb Law Firm

(57) ABSTRACT

The present disclosure provides a fan-out structure and a method for manufacturing the same, and a display panel, relating to the field of display technology. The fan-out structure includes a plurality of fan-out units for connecting a drive circuit to a display area, wherein each of the fan-out units includes a fan-out line, and at least one of the fan-out units further includes a resistance adjustment unit connected to a corresponding fan-out line, and the resistance adjust- (Continued)

ment unit is configured to make a resistance difference between different fan-out units smaller than a first threshold.

15 Claims, 6 Drawing Sheets

(56) References Cited

FOREIGN PATENT DOCUMENTS

| | | | |
|---|---|---|---|
| CN | 102315211 | A | 1/2012 |
| CN | 103149753 | A | 6/2013 |
| CN | 103474435 | A | 12/2013 |
| CN | 108258025 | A | 7/2018 |

OTHER PUBLICATIONS

International Search Report and Written Opinion for International Appl. No. PCT/CN2018/101946, dated Mar. 14, 2019.
Second Office Action for CN Appl. No. 201810083800.2, dated Aug. 14, 2019.

* cited by examiner

FAN-OUT STRUCTURE AND METHOD FOR MANUFACTURING THE SAME, AND DISPLAY PANEL

CROSS-REFERENCE TO RELATED APPLICATIONS

The present application is a U.S. National Stage Application under 35 U.S.C. § 371 of International Patent Application No. PCT/CN2018/101946, filed on Aug. 23, 2018, which claims priority to China Patent Application No. 201810083800.2, filed on Jan. 29, 2018, the disclosure of both of which are incorporated by reference herein in entirety.

TECHNICAL FIELD

The present disclosure relates to the field of display technology, in particular to a fan-out structure and a method for manufacturing the same, and a display panel.

BACKGROUND

In a display panel of an AMOLED (Active matrix organic light emitting diode) or the like, fan-out lines are used to connect a drive circuit to a display area.

Generally, fan-out lines connected to the edge of the display area is longer, and fan-out lines connected to the middle position of the display area is shorter. This may cause a large resistance difference between different fan-out lines, and result in uneven display at different positions of the display panel.

The resistance difference between different fan-out lines is reduced by lengthening the shorter fan-out lines in related technologies, for example, arranging the shorter fan-out lines in a bent shape to lengthen the fan-out lines.

SUMMARY

According to one aspect of embodiments of the present disclosure, a fan-out structure is provided. The fan-out structure comprises a plurality of fan-out units for connecting a drive circuit to a display area. Each of the fan-out units comprises a fan-out line, and at least one of the fan-out units further comprises a resistance adjustment unit connected to a corresponding fan-out line. The resistance adjustment unit is configured to make a resistance difference between different fan-out units smaller than a first threshold.

In some embodiments, the resistance adjustment unit comprises a conductive area; each of the at least one of the fan-out units further comprises an insulating layer on the conductive area, and the insulating layer defines an opening for exposing a part of the conductive area; the fan-out line of each of the at least one of the fan-out units comprises a first portion and a second portion spaced from each other on the insulating layer, wherein the first portion covers a first area of the conductive area at the bottom of the opening, and the second portion covers a second area of the conductive area at the bottom of the opening.

In some embodiments, the opening comprises a first via and a second via; the first area is the conductive area at the bottom of the first via, and the second area is the conductive area at the bottom of the second via.

In some embodiments, the conductive area comprises doped polysilicon.

In some embodiments, the fan-out units comprise a first group of fan-out units and at least one second group of fan-out units other than the first group of fan-out units, wherein an average resistance of fan-out lines of the first group of fan-out units is larger than that of the second group of fan-out units, and each fan-out unit of the at least one second group of fan-out units comprises the resistance adjustment unit connected to the corresponding fan-out line.

In some embodiments, the first group of fan-out units comprises a plurality of fan-out units, each of the at least one second group of fan-out units comprises a plurality of fan-out units, and the resistance difference between fan-out lines of any two fan-out units in each group of fan-out units is smaller than a second threshold.

In some embodiments, the first group of fan-out units comprises one fan-out unit.

According to other aspect of embodiments of the present disclosure, a display panel is provided. The display panel comprises the fan-out structure according to any embodiment of the above embodiments.

According to still other aspect of embodiments of the present disclosure, a method for manufacturing a fan-out structure. The method comprises: providing a substrate; and forming a plurality of fan-out units for connecting a drive circuit to a display area on the substrate, wherein each of the fan-out units comprises a fan-out line, and at least one of the fan-out units further comprises a resistance adjustment unit connected to a corresponding fan-out line, and the resistance adjustment unit is configured to make a resistance difference between different fan-out units smaller than a first threshold.

In some embodiments, the forming a plurality of fan-out units on the substrate comprises: forming a plurality of conductive areas on the substrate; forming an insulating layer on each conductive area, wherein the insulating layer defines an opening for exposing a part of the corresponding conductive area; and forming a fan-out line on the insulating layer, the fan-out line comprising a first portion and a second portion spaced from each other, wherein the first portion covers a first area of the conductive area at the bottom of the opening, and the second portion covers a second area of the conductive area at the bottom of the opening.

In some embodiments, the opening comprises a first via and a second via; the first area is the conductive area at the bottom of the first via, and the second area is the conductive area at the bottom of the second via.

In some embodiments, each conductive area comprises doped polysilicon.

In some embodiments, each conductive area comprises undoped polysilicon; the forming an insulating layer on each conductive area comprises: forming an insulating material layer on each conductive area; performing a doping process to dope the undoped polysilicon; and patterning the insulating material layer to form the insulating layer.

In some embodiments, in the step of forming the fan-out line, the sizes and positions of the first area and the second area are adjusted to make the resistance difference between different fan-out units smaller than the first threshold.

In some embodiments, the fan-out units comprise a first group of fan-out units and at least one second group of fan-out units other than the first group of fan-out units, wherein an average resistance of fan-out lines of the first group of fan-out units is larger than that of the second group of fan-out units, and each fan-out unit of the at least one second group of fan-out units comprises the resistance adjustment unit connected to the corresponding fan-out line.

In some embodiments, the first group of fan-out units comprises a plurality of fan-out units, each of the at least one second group of fan-out units comprises a plurality of fan-out units, and the resistance difference between fan-out lines of any two fan-out units in each group of fan-out units is smaller than a second threshold.

In some embodiments, the first group of fan-out units comprises one fan-out unit.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 1:
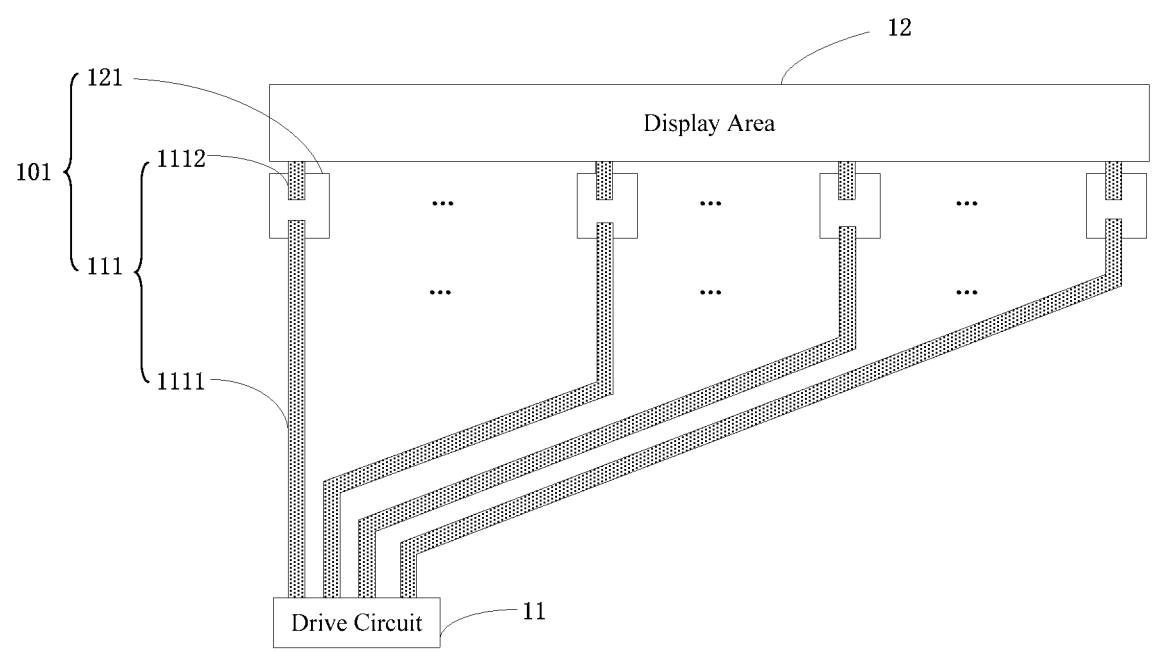
FIG. 1 is a top view of a fan-out structure according to some embodiments of the present disclosure.

FIG. 1 is a top view of a fan-out structure according to some embodiments of the present disclosure. As shown in FIG. 1, the fan-out structure may comprise a plurality of fan-out units 101 for connecting a drive circuit 11 to a display area 12. Here, the drive circuit 11 may be a gate drive circuit or a source drive circuit. It should be understood that display area 12 may also be referred to as an active area.

Each fan-out unit 101 comprises a fan-out line 111. At least one fan-out unit 101 further comprises a resistance adjustment unit 121 connected to a corresponding fan-out line 111. The different resistance adjustment units 121 are configured to make the resistance difference between different fan-out units 101 smaller than a first threshold.

For example, a part of the fan-out units 101 may each comprise a resistance adjustment unit 121 connected to a corresponding fan-out line 111. For another example, all of the fan-out units 101 may each comprise a resistance adjustment unit 121 connected to a corresponding fan-out line 111.

In some embodiments, the fan-out line 111 may comprise a first portion 1111 for connecting the drive circuit 11 to the resistance adjustment unit 121, and a second portion 1112 for connecting the resistance adjustment unit 121 to the display area 12.

It can be understood that it is better that the resistance difference between different fan-out units 101 is smaller. Therefore, different resistance adjustment units 121 can be configured to make the resistances of different fan-out units 101 substantially identical.

It should be noted that the first threshold may be set according to actual conditions. For example, for a high-resolution display panel, the resistance differences between different fan-out units 101 need to be as small as possible, so the first threshold can be set to a smaller first value. For a low-resolution display panel, the resistance differences between different fan-out units 101 can be appropriately increased with respect to that for the high-resolution display panel, so the first threshold can be set to a second value greater than the first value. In some implementations, for example, the first threshold may range from 300 to 500Ω, e.g., 350Ω, 400Ω, 450Ω, etc.

In the above embodiments, at least one fan-out unit comprises a resistance adjustment unit connected to a fan-out line. The resistance difference between different fan-out units can be effectively reduced by providing the resistance adjustment unit, thereby the problem of uneven display can be mitigated and the requirements of a high-resolution display panel can be met. In addition, the fan-out lines can be arranged in a simple sector shape (as shown in FIG. 1), which can save space and facilitate the design of a narrow-bezel display panel. Furthermore, since the space can be saved, the spacing of the fan-out lines can be increased to mitigate a short-circuit problem between the fan-out lines in case where the resistance adjustment unit is provided to reduce the resistance difference between different fan-out units.

In some embodiments, the plurality of fan-out units may comprise a first group of fan-out units and at least one second group of fan-out units other than the first group of fan-out units. The average resistance of fan-out lines of the first group of fan-out units is larger than that of the second group of fan-out units. Each fan-out unit of the at least one second group of fan-out units may comprise a resistance adjustment unit connected to a corresponding fan-out line, and the first group of fan-out units may not comprise a resistance adjustment unit. Here, the first group of fan-out units comprises at least one fan-out unit, and the second group of fan-out units comprises at least one fan-out unit.

For example, the first group of fan-out units may comprise only one fan-out unit having a fan-out line with the largest resistance; and the second group of fan-out units may comprise one or more fan-out units. That is, fan-out units other than the fan-out unit having a fan-out line with the largest resistance may each comprise a resistance adjustment unit. In this case, for each fan-out unit, the resistance of the fan-out unit can be adjusted by adjusting the connection mode of the fan-out line and the resistance adjustment unit.

For another example, the first group of fan-out units may comprise a plurality of fan-out units, the second group of fan-out units may also comprise a plurality of fan-out units, and the resistance difference between fan-out lines of any two fan-out units in each group of fan-out units is smaller than a second threshold. Here, the resistance difference between fan-out lines is smaller than the second threshold can be also understood as that the resistance difference between fan-out lines meets a preset requirement. In this case, the fan-out line and the resistance adjustment unit of each fan-out unit in the same second group of fan-out units can be connected in the same connection mode. In some implementations, for example, the second threshold may range from 0 to 100Ω, e.g., 30Ω, 50Ω, 80Ω, etc.

Different implementations of the fan-out unit 101 (i.e., at least one fan-out unit described above) having the resistance adjustment unit 1112 will be described in the following.

Figure 2A:
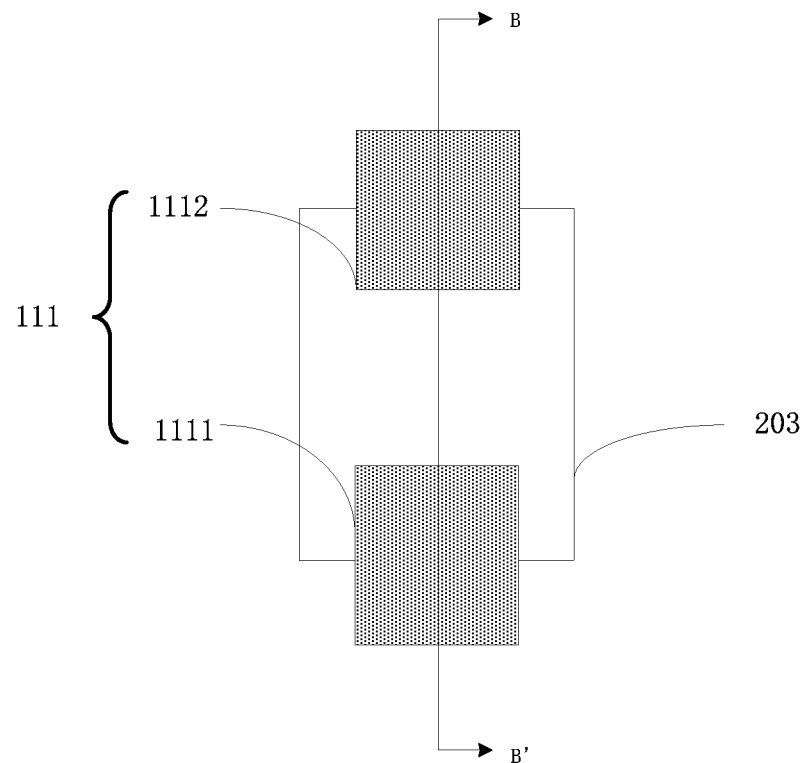
FIG. 2A is a top view of a fan-out unit according to some implementations of the present disclosure.
Figure 2B:
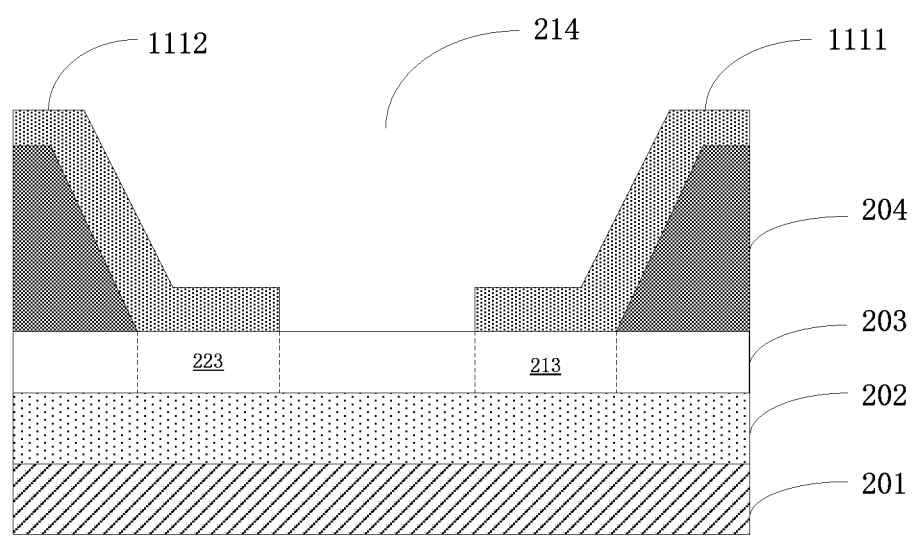
FIG. 2B is a cross-sectional view taken along line B-B' of FIG. 2A.

FIG. 2A is a top view of a fan-out unit according to some implementations of the present disclosure. FIG. 2B is a cross-sectional view taken along line B-B' of FIG. 2A.

Referring to FIG. 2A and FIG. 2B, the fan-out unit 101 may comprise a conductive area 203 (i.e., a resistance adjustment unit) on a substrate 201, an insulating layer 204 on the conductive area 203, and a fan-out line 111 on the insulating layer 204. In some embodiments, the conductive area 203 may comprise doped polysilicon, for example, heavily doped polysilicon. In some embodiments, the fan-out unit 101 may further comprise a buffer layer 202 between the substrate 201 and the conductive area 203. The buffer layer 202 may be, for example, a laminate composed of alternating organic layers and inorganic layers. The buffer layer 202 can serve waterproof function and anti-oxidation function.

Here, the insulating layer 204 defines an opening 214 for exposing a part of the conductive area 203. The fan-out line 111 comprises a first portion 1111 and a second portion 1112 spaced from each other on the insulating layer 204. The first portion 1111 covers a first area 213 of the conductive area 203 at the bottom of the opening 214, and the second portion 1112 covers a second area 223 of the conductive area 203 at the bottom of the opening 214.

The size of the first area 213 determines the contact area of the first portion 1111 and the conductive area 203, and the size of the second area 223 determines the contact area of the second portion 1112 and the conductive area 203. The positions of the first area 213 and the second area 223 determine the size of the conductive area between the first area 213 and the second area 223. Therefore, the resistance of a corresponding fan-out unit can be adjusted by adjusting the sizes and positions of the first area 213 and the second area 223, so that the resistance differences between different fan-out units meet the requirement, for example, substantially identical.

Figure 3A:
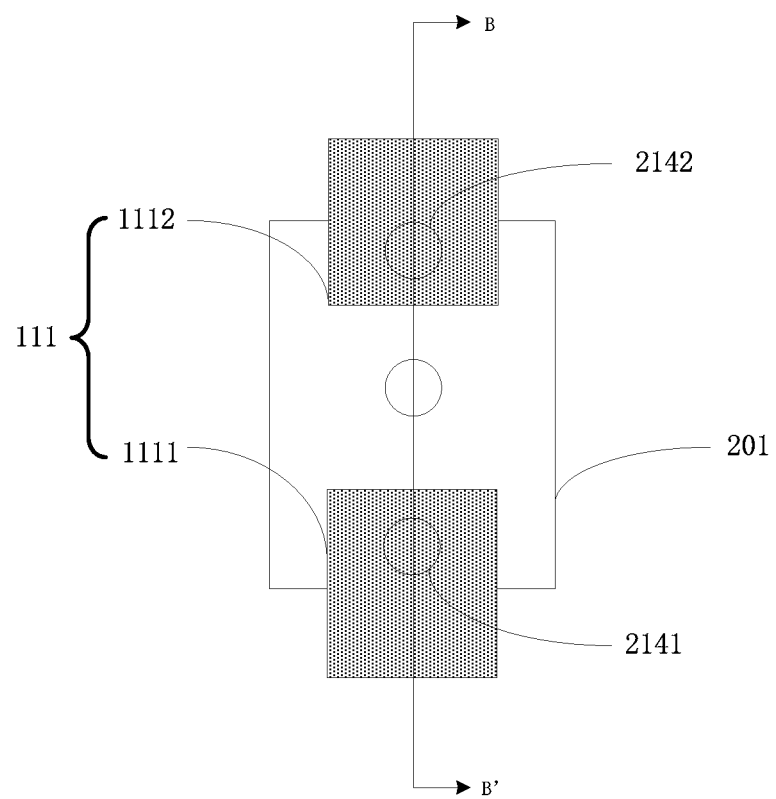
FIG. 3A is a top view of a fan-out unit according to other implementations of the present disclosure.
Figure 3B:
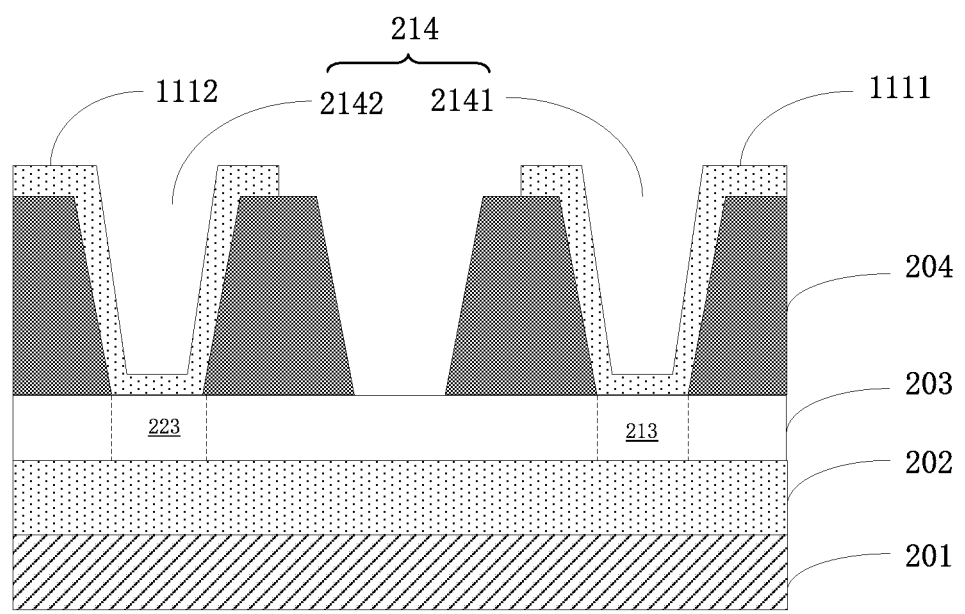
FIG. 3B is a cross-sectional view taken along line B-B' of FIG. 3A.

FIG. 3A is a top view of a fan-out unit according to other implementations of the present disclosure. FIG. 3B is a cross-sectional view taken along line B-B' of FIG. 3A. It should be noted that the difference from the fan-out unit shown in FIG. 2A and FIG. 2B will be focused on in the following, and other same or similar parts can be referred to the above description.

Referring to FIG. 3A and FIG. 3B, the insulating layer 204 of the fan-out unit 101 defines an opening 214 for exposing a part of the conductive area 203. Compared to the fan-out unit shown in FIG. 2A and FIG. 2B, the opening 214 herein may comprise a first via 2141 and a second via 2142. The first portion 1111 may cover the conductive area 203 at the bottom of the first via 2141 (corresponding to the first area 213), and the second portion 1112 may cover the conductive area 203 at the bottom of the second via 2142 (corresponding to the second area 223).

In the above implementations, the resistance of a corresponding fan-out unit can be adjusted by adjusting the sizes of the first via 2141 and the second via 2142, the number of the first via 2141 and the second via 2142 and the distance between the first via 2141 and the second via 2142, so that the resistance differences between different fan-out units meet the requirements, for example, substantially identical.

In addition, in the fan-out units shown in FIG. 2A, FIG. 2B, FIG. 3A and FIG. 3B, the resistance of the fan-out units can also be adjusted by adjusting the doping concentration of the conductive area.

Figure 4:
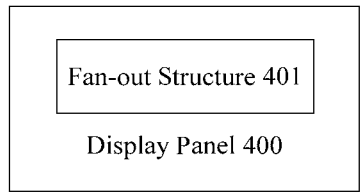
FIG. 4 is a schematic structural view showing a display panel according to some embodiments of the present disclosure.

FIG. 4 is a schematic structural view showing a display panel according to some embodiments of the present disclosure. As shown in FIG. 4, the display panel 400 may comprise the fan-out structure 401 according to any one of the above embodiments. For example, the display panel 400 may comprise, but not limited to, an AMOLED display panel, a liquid crystal display panel, etc.

Figure 5:
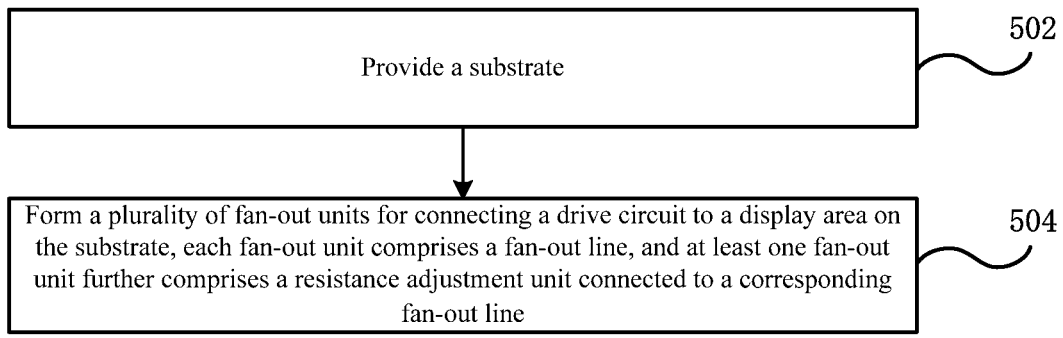
FIG. 5 is a schematic flow chart illustrating a method for manufacturing a fan-out structure according to some embodiments of the present disclosure.

FIG. 5 is a schematic flow chart illustrating a method for manufacturing a fan-out structure according to some embodiments of the present disclosure.

At step 502, a substrate is provided. The substrate may be a glass substrate, etc. In some embodiments, the substrate may be a flexible substrate.

At step 504, a plurality of fan-out units for connecting a drive circuit to a display area are formed on the substrate.

Here, each fan-out unit comprises a fan-out line, and at least one fan-out unit further comprises a resistance adjustment unit connected to a corresponding fan-out line. The resistance adjustment unit is configured to make resistance difference between different fan-out units smaller than a first threshold.

A fan-out structure in which at least one fan-out unit comprises a resistance adjustment unit connected to a fan-out line can be formed in the above embodiment. The resistance difference between different fan-out units can be effectively reduced by the resistance adjustment unit, thereby the problem of uneven display can be improved and the requirements of a high-resolution display panel can be met. In addition, the fan-out lines can be arranged in a simple sector shape, which can save space and facilitate the design of a narrow-bezel display panel.

Figure 6:
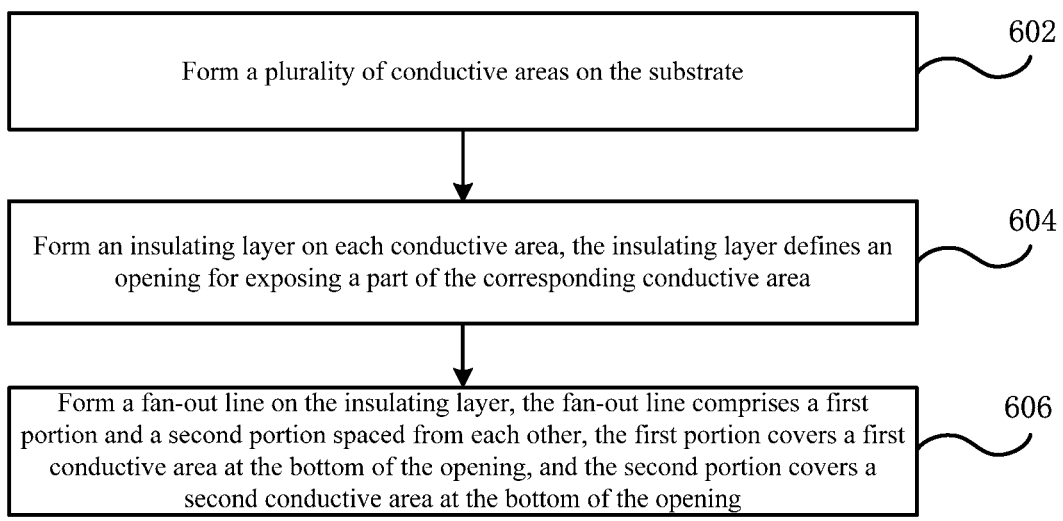
FIG. 6 is a schematic flow chart illustrating a method for forming a plurality of fan-out units according to some embodiments of the present disclosure.
Figure 7A:
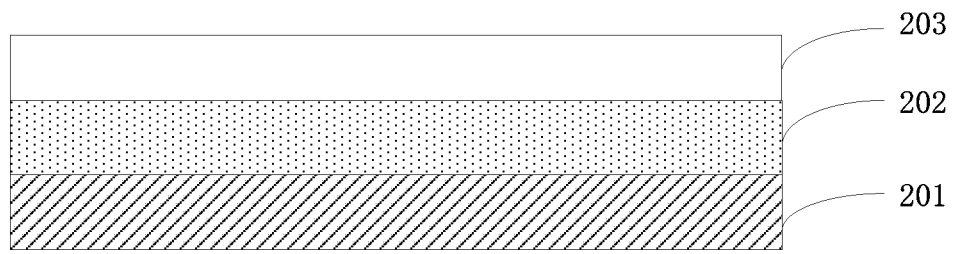
FIGS. 7A-7C are cross-sectional views showing structures obtained at different stages of forming a fan-out unit according to some embodiments of the present disclosure.
Figure 7B:
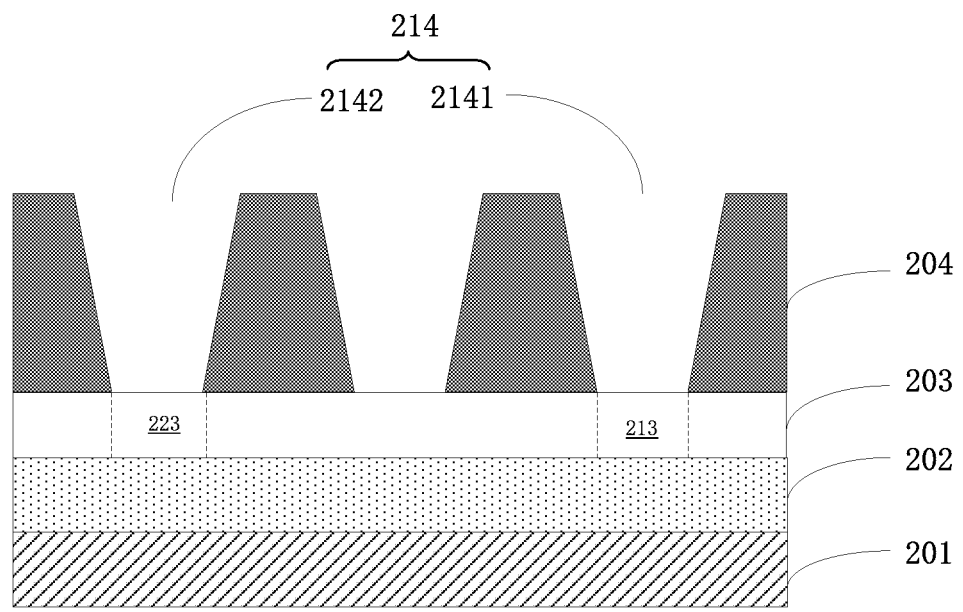
Figure 7C:
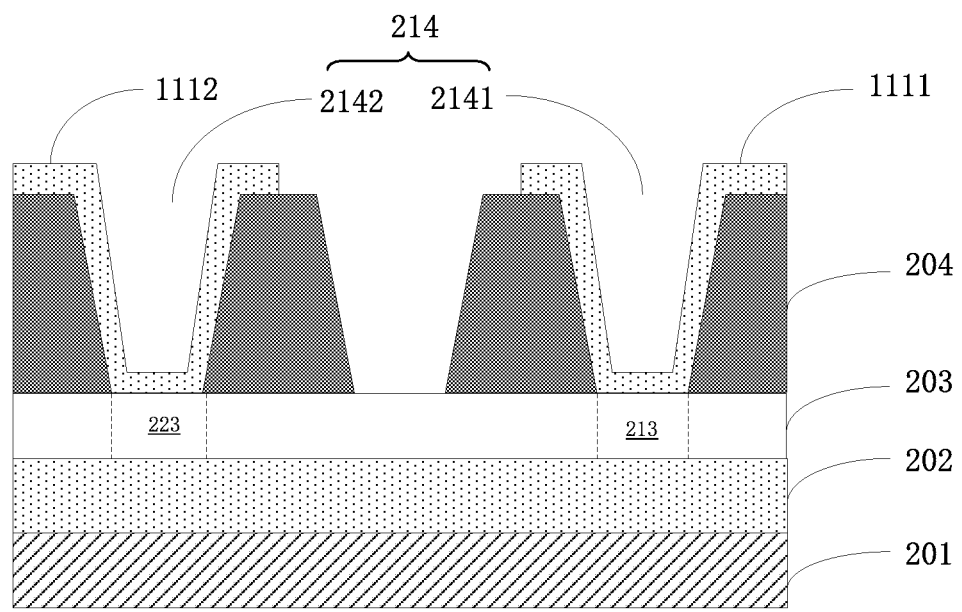

FIG. 6 is a schematic flow chart illustrating a method for forming a plurality of fan-out units according to some embodiments of the present disclosure. FIGS. 7A-7C are cross-sectional views showing structures obtained at different stages of forming a fan-out unit according to some embodiments of the present disclosure. A forming process of a fan-out unit according to some embodiments of the present disclosure will be described in the following with reference to FIG. 6 and FIGS. 7A-7C.

At first, at step 602, a plurality of conductive areas 203 are formed on the substrate 201.

As shown in FIG. 7A, a conductive area 203 is formed above the substrate 201. In some embodiments, a buffer layer 202 may be formed on the substrate 201 first, and then the conductive area 203 is formed on the buffer layer 202. The buffer layer 202 may be, for example, a laminate composed of alternating organic layers and inorganic layers. The buffer layer 202 can serve waterproof function and anti-oxidation function.

In some implementations, polysilicon needs to be deposited during the formation of an AMOLED by using a low temperature polysilicon (LTPS) process, and the plurality of conductive areas 203 can be formed simultaneously while the polysilicon is deposited.

Next, at step 604, an insulating layer 204 is formed on each conductive area 203.

As shown in FIG. 7B, the insulating layer 204 has an opening 214 for exposing a part of the corresponding conductive area 203. In some implementations, the opening 214 may comprise a first via 2141 and a second via 2142. The first via 2141 may expose the first area 213 of the conductive area 203, and the second via 2142 may expose the second area 223 of the conductive area 203.

In some embodiments, the insulating layer 204 may comprise a first insulating layer and a second insulating layer on the first insulating layer, and the opening 214 may penetrate through the first insulating layer and the second insulating layer to make a part of the conductive area 203 exposed. In some implementations, the insulating layer 204 may comprise a silicon nitride or a silicon oxide, etc.

It should be noted that the conductive area formed in step 602 may comprise doped polysilicon or undoped polysilicon. If the conductive area is undoped polysilicon, the undoped polysilicon may be doped in the process of forming the insulating layer 204 in step 604. For example, an insulating material layer (not shown) may be formed on the conductive area 203, then a doping process is performed to dope the undoped polysilicon, and then the insulating material layer is patterned to form the insulating layer 204 defining the opening 214.

Next, at step 606, forming a fan-out line 101 on the insulating layer 204.

As shown in FIG. 7C, the fan-out line 101 may comprise a first portion 1111 and a second portion 1112 spaced from each other. The first portion 1111 may cover the first area 213 of the conductive area 203 at the bottom of the opening 214, and the second portion 1112 may cover the second area 213 of the conductive area 203 at the bottom of the opening 214. In a case where the opening 214 comprises a first via 2141 and a second via 2142, the first portion 1111 may cover the conductive area 203 at the bottom of the first via 2141 (i.e., the first area 213), and the second portion 1112 may cover the conductive area 203 at the bottom of the second via 2142 (i.e., the second area 223).

In the step of forming the fan-out line 101, the sizes and positions of the first area 213 and the second area 223 may be adjusted such that the resistance difference between different fan-out units is smaller than a first threshold.

Moreover, in some embodiments, after the fan-out line 101 is formed, a planarization layer such as an organic material layer may be further deposited on the structure shown in FIG. 7C.

In the above embodiments, a plurality of fan-out units may be simultaneously formed in the process of forming an AMOLED by using a low temperature polysilicon (LTPS) process without adding masks, additional process and cost.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A fan-out structure, comprising a plurality of fan-out units for connecting a drive circuit to a display area, wherein:
    each of the fan-out units comprises a fan-out line; and
    at least one of the fan-out units further comprises a resistance adjustment unit comprising a conductive area and connected to a corresponding fan-out line, and the resistance adjustment unit is configured to make a resistance difference between different fan-out units smaller than a first threshold, wherein:
    each of the at least one of the fan-out units further comprises an insulating layer on the conductive area, and the insulating layer defines an opening for exposing a part of the conductive area; and
    the fan-out line of each of the at least one of the fan-out units comprises a first portion and a second portion spaced from each other on the insulating layer, wherein the first portion is continuous, the first portion covers and is in contact with a first area of the conductive area at a bottom of the opening, the second area is continuous, and the second portion covers and is in contact with a second area of the conductive area at the bottom of the opening.

2. The fan-out structure according to claim 1, wherein:
the opening comprises a first via and a second via; and
the first area is the conductive area at a bottom of the first via, and the second area is the conductive area at a bottom of the second via.

3. The fan-out structure according to claim 1, wherein the conductive area comprises doped polysilicon.

4. The fan-out structure according to claim 1, wherein the fan-out units comprise a first group of fan-out units and at least one second group of fan-out units other than the first group of fan-out units, wherein an average resistance of fan-out lines of the first group of fan-out units is larger than that of fan-out lines of the second group of fan-out units, and each fan-out unit of the at least one second group of fan-out units comprises the resistance adjustment unit connected to the corresponding fan-out line.

5. The fan-out structure according to claim 4, wherein the first group of fan-out units comprises a plurality of fan-out units, each of the at least one second group of fan-out units comprises a plurality of fan-out units, and a resistance difference between fan-out lines of any two fan-out units in each group of fan-out units is smaller than a second threshold.

6. The fan-out structure according to claim 4, wherein the first group of fan-out units comprises one fan-out unit.

7. A display panel, comprising the fan-out structure according to claim 1.

8. A method for manufacturing a fan-out structure, comprising:
providing a substrate; and
forming a plurality of fan-out units for connecting a drive circuit to a display area on the substrate, wherein each of the fan-out units comprises a fan-out line, and at least one of the fan-out units further comprises a resistance adjustment unit comprising a conductive area and connected to a corresponding fan-out line, and the resistance adjustment unit is configured to make a resistance difference between different fan-out units smaller than a first threshold, wherein:
each of the at least one of the fan-out units further comprises an insulating layer on the conductive area, and the insulating layer defines an opening for exposing a part of the conductive area; and
the fan-out line of each of the at least one of the fan-out units comprises a first portion and a second portion spaced from each other on the insulating layer, wherein the first portion is continuous, the first portion covers and is in contact with a first area of the conductive area at a bottom of the opening, the second area is continuous, and the second portion covers and is in contact with a second area of the conductive area at the bottom of the opening.

9. The method according to claim 8, wherein:
the opening comprises a first via and a second via; and
the first area is the conductive area at a bottom of the first via, and the second area is the conductive area at a bottom of the second via.

10. The method according to claim 8, wherein each conductive area comprises doped polysilicon.

11. The method according to claim 8, wherein:
each conductive area comprises undoped polysilicon;
the forming an insulating layer on each conductive area comprises:
forming an insulating material layer on each conductive area;
performing a doping process to dope the undoped polysilicon; and
patterning the insulating material layer to form the insulating layer.

12. The method according to claim 8, wherein in the step of forming the fan-out line, sizes and positions of the first area and the second area are adjusted to make the resistance difference between different fan-out units smaller than the first threshold.

13. The method according to claim 8, wherein the fan-out units comprise a first group of fan-out units and at least one second group of fan-out units other than the first group of fan-out units, wherein an average resistance of fan-out lines of the first group of fan-out units is larger than that of fan-out lines of the second group of fan-out units, and each fan-out unit of the at least one second group of fan-out units comprises the resistance adjustment unit connected to the corresponding fan-out line.

14. The method according to claim 13, wherein the first group of fan-out units comprises a plurality of fan-out units, each of the at least one second group of fan-out units comprises a plurality of fan-out units, and a resistance difference between fan-out lines of any two fan-out units in each group of fan-out units is smaller than a second threshold.

15. The method according to claim 13, wherein the first group of fan-out units comprises one fan-out unit.

* * * * *